(12) United States Patent
Gao et al.

(10) Patent No.: US 9,634,111 B2
(45) Date of Patent: Apr. 25, 2017

(54) PASSIVATION TECHNIQUE FOR WIDE BANDGAP SEMICONDUCTOR DEVICES

(71) Applicant: Massachusetts Institute of Technology, Cambridge, MA (US)

(72) Inventors: Feng Gao, Cambridge, MA (US); Di Chen, Cambridge, MA (US); Bin Lu, Boston, MA (US); Tomas Apostol Palacios, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/396,507

(22) PCT Filed: Apr. 23, 2013

(86) PCT No.: PCT/US2013/037726
§ 371 (c)(1),
(2) Date: Oct. 23, 2014

(87) PCT Pub. No.: WO2013/163137
PCT Pub. Date: Oct. 31, 2013

(65) Prior Publication Data
US 2015/0091061 A1    Apr. 2, 2015

Related U.S. Application Data

(60) Provisional application No. 61/636,787, filed on Apr. 23, 2012.

(51) Int. Cl.
*H01L 23/31*     (2006.01)
*H01L 29/66*     (2006.01)
(Continued)

(52) U.S. Cl.
CPC .... *H01L 29/66462* (2013.01); *H01L 23/3171* (2013.01); *H01L 23/3192* (2013.01);
(Continued)

(58) Field of Classification Search
CPC ............. H01L 23/3171; H01L 23/3192; H01L 29/2003
See application file for complete search history.

(56) References Cited

U.S. PATENT DOCUMENTS 7,902,083 B2   3/2011   Bedinger et al.
8,148,830 B2   4/2012   Bedinger et al.
(Continued)

OTHER PUBLICATIONS

Arulkumaran, et al., "Surface passivation effects on AlGaN/GaN high-electron=mobility transistors with SiO2, Si3N4 and silicon oxynitridem," Appl. Phys. Lett, vol. 84, No. 4, pp. 613-615, Jan. 26, 2004.
(Continued)

*Primary Examiner* — Amar Movva
(74) *Attorney, Agent, or Firm* — Wolf, Greenfield & Sacks, P.C.

(57) ABSTRACT

A method of protecting a semiconductor structure from water and a semiconductor structure formed by the method. The semiconductor structure includes a wide-bandgap semiconductor material in which at least one semiconductor device is formed. The method includes heating the semiconductor structure in a vacuum to a temperature of at least 200° C. to remove water from the semiconductor structure. The method also includes, after the heating of the semiconductor structure, forming a layer comprising a hydrophobic material over the semiconductor structure. The semiconductor structure is kept in the vacuum between the heating of the semiconductor structure and the forming of the layer comprising the hydrophobic material.

20 Claims, 12 Drawing Sheets

(51) Int. Cl.
*H01L 29/20* (2006.01)
*H01L 29/778* (2006.01)

(52) U.S. Cl.
CPC ........ *H01L 29/2003* (2013.01); *H01L 29/778* (2013.01); *H01L 2924/0002* (2013.01)

(56) References Cited

U.S. PATENT DOCUMENTS

| | | |
|---|---|---|
| 8,173,906 B2 | 5/2012 | Bedinger et al. |
| 8,318,562 B2 | 11/2012 | Khan et al. |
| 2003/0052403 A1 | 3/2003 | Quek et al. |
| 2009/0090984 A1 | 4/2009 | Khan et al. |
| 2009/0290314 A1 | 11/2009 | Bedinger et al. |
| 2009/0291200 A1 | 11/2009 | Bedinger et al. |
| 2010/0099217 A1 | 4/2010 | Isa et al. |
| 2011/0140172 A1 | 6/2011 | Chu et al. |
| 2011/0287203 A1 | 11/2011 | Victor et al. |
| 2012/0313199 A1 | 12/2012 | Orita et al. |

OTHER PUBLICATIONS

Gao et al., "Impact of Moisture and Fluorocarbon Passivation on the Current Collapse of AlGaN/GaN HEMTs," IEEE Electron Device Letters, vol. 33, No. 10, Oct. 2014, pp. 1378-1380.

Gila, et al., "Improved oxide passivation of AlGaN/GaN high electron mobility transistors," Appl. Phys. Lett., vol. 87, No. 16, p. 163503, 2005.

Green, et al., "The effect of surface passivation on the microwave characteristics of undoped AlGaN/GaN HEMTs," IEEE Electron Device Lett., vol. 21, No. 6, pp. 268-270, Jun. 2000.

Hwang, et al., "Effects of a molecular beam epitaxy grown AlN passivation layer on AlGaN/GaN heterojection field effect transistors," Solid State Electron., vol. 48, No. 2, pp. 363-366, 2004.

International Search Report and Written Opinion issued on Aug. 16, 2013, by the United States International Searching Authority in international application No. PCT/US13/37726, filed Apr. 23, 2013, 9 pages.

Kim et al. Effects of SiN Passivation and High-Electric Field on AlGaN—GaN HFET Degradation, IEEE Electron Device Letters, vol. 24, No. 7, Jul. 2003.

Koley et al., Slow Transients Observed in AlGaN/GaN HFETS: Effects of SiNx Passivation and UV Illumination. IEEE Transactions on Electron Devices, vol. 50, No. 4, Apr. 2003.

Lu et al. A comparative study of surface passivation on AlGaN/GaN HEMTs, Solid-State Electronics 46 (2002) 1441-1444.

Matsumura et al. Recent situation of industrial implementation of Cat-CVD technology in Japan, Thin Solid Films 516 (2008) 537-540.

Moser, et al., "Effects of surface treatments on isolation currents in AlGaN/GaN high-electromobility transistors," Appl. Phys. Lett., vol. 83, No. 20, pp. 4178-4180, Nov. 17, 2003.

Saadat, et al., "Gate-first AlGaN/GaN HEMTs technology for high frequency applications," IEEE Electron Device Lett., vol. 30, No. 12, pp. 1254-1256, Dec. 2009.

Vetury, et al., "The impact of surface states on the DC and FR characteristics of AlGaN/Gan HFETs," IEEE Trans. Electron Devices, vol. 48, No. 3, pp. 560-566, Mar. 2001.

PASSIVATION TECHNIQUE FOR WIDE BANDGAP SEMICONDUCTOR DEVICES

CROSS-REFERENCE TO RELATED APPLICATIONS

This application is a U.S. National Stage Application of International Application PCT/US2013/037726, filed Apr. 23, 2013, which claims priority to U.S. provisional application Ser. No. 61/636,787, titled "NEW PASSIVATION METHOD FOR SEMICONDUCTOR DEVICES," filed Apr. 23, 2012, each of which is hereby incorporated by reference in its entirety.

STATEMENT REGARDING FEDERALLY SPONSORED RESEARCH OR DEVELOPMENT

This invention was made with government support under Grant No. N00014-08-1-0655 awarded by the Office of Naval Research. The government has certain right in the invention.

BACKGROUND

1. Field of Invention

Described herein are techniques that can improve the performance of semiconductor devices (e.g., transistors and diodes) formed of wide bandgap semiconductor materials. Such devices may be used in applications such as power electronics, power amplification and digital electronics, by way of example.

2. Discussion of the Related Art

Improved power transistors are desired for advanced transportation systems, more robust energy delivery networks and new approaches to high-efficiency electricity generation and conversion. Such systems rely on very efficient converters to step-up or step-down electric voltages, and use power transistors capable of blocking large voltages. In hybrid vehicles, for example, power transistors with blocking voltages of more than 500 V are used to convert DC power from the batteries to AC power to operate the electric motor.

Conventional power devices (e.g., transistors or diodes) used in such applications are made of silicon. However, the limited critical electric field of silicon and its relatively high resistance causes available commercial devices, circuits and systems to be very large and heavy, and operate at low frequencies. Therefore, such commercial devices are unsuitable for future generations of hybrid vehicles and other applications.

Nitride semiconductor devices have been proposed as offering the potential for producing high-efficiency power electronics demanding high blocking voltages and low on-resistances.

SUMMARY

Some embodiments relate to a method of protecting a semiconductor structure from water. The semiconductor structure includes a wide-bandgap semiconductor material in which at least one semiconductor device is formed. The method includes heating the semiconductor structure in a vacuum to a temperature of at least 200° C. to remove water from the semiconductor structure. The method also includes, after the heating of the semiconductor structure, forming a layer comprising a hydrophobic material over the semiconductor structure. The semiconductor structure is kept in the vacuum between the heating of the semiconductor structure and the forming of the layer comprising the hydrophobic material.

Some embodiments relate to a semiconductor structure formed by a method as described above.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1A:
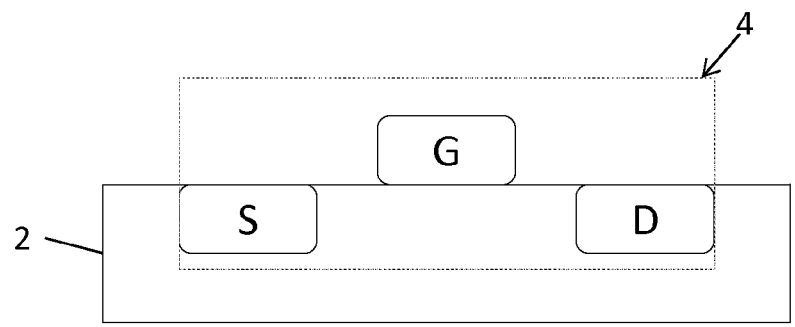
FIG. 1A shows an example of a semiconductor device formed in a semiconductor structure.

Although nitride-based semiconductor devices offer significant potential, there are several technical problems in conventional nitride-based semiconductor devices to be resolved. Some of the most challenging problems are the current collapse, dynamic on-resistance and DC-RF dispersion observed in nitride-based semiconductor devices, as well as the long term reliability and robustness of such devices. Experimentally, it is observed that the output power and efficiency at microwave frequencies of amplifiers formed of gallium nitride (GaN) based semiconductor devices is well below that calculated from DC performance. The efficiency of power electronics formed of gallium nitride (GaN) based semiconductor devices drops due to the increase of the on-resistance of the transistors at high switching frequencies. Further, device performance has been observed to degrade over time. The techniques described herein enable reducing the current collapse and DC-RF dispersion and improving the reliability such devices.

The present inventors have recognized and appreciated that current collapse, DC-RF dispersion and low reliability can be caused by the presence of water molecules at the surface of the semiconductor wafer. The high voltages that may be sustained by wide-bandgap semiconductor materials, such as nitride semiconductor materials (e.g., GaN), may cause electrochemical reactions to occur at the surface of the semiconductor wafer when exposed to moisture. Such reactions may degrade the semiconductor device, leading to decreases in performance, efficiency and/or reliability. In some embodiments, performance, efficiency and reliability can be significantly improved by removing water molecules from the surface of the semiconductor wafer, and by depositing a hydrophobic material to prevent the adsorption of water molecules.

The techniques described herein may be particularly useful for protecting wide-bandgap semiconductor materials. As used herein, the term "wide bandgap semiconductor material" refers to a semiconductor material having a bandgap larger than that of silicon. Examples of wide-bandgap semiconductor materials include GaN, AlN, $In_xAl_yGa_zN$, ZnO, $Ga_2O_3$, AlN, SiC, and diamond. However, the techniques described herein are not limited in this respect.

In some embodiments, semiconductor devices formed of wide-bandgap semiconductor material(s) can be protected from atmospheric water molecules by vacuum annealing the semiconductor structure above 200° C. and subsequently in-situ depositing a layer of hydrophobic material over the semiconductor structure. In some embodiments, the semiconductor structure is not removed from the vacuum between the step of vacuum annealing and the step of deposition of the layer of hydrophobic material. The layer of hydrophobic material may be deposited directly on the semiconductor surface, on a dielectric passivation layer or embedded in a dielectric passivation layer, for example, as the techniques described herein are not limited as to the position of the layer of hydrophobic material.

FIG. 1A shows a cross section of a semiconductor structure 2 (e.g., a semiconductor wafer or chip) including a wide-bandgap semiconductor material. Any suitable wide-bandgap semiconductor material may be included in semiconductor structure 2. As an example, a nitride semiconductor material may be used such as $Al_xIn_yGa_zN$, for example, in which x, y and z each have any suitable value between zero and one (inclusive), and x+y+z=1. Such a material can include GaN, aluminum nitride (AlN), Indium nitride (InN) or any combination thereof. However, any suitable nitride-based semiconductor material or other wide-bandgap semiconductor material may be included in semiconductor structure 2. In some embodiments, a semiconductor heterostructure may be formed in the semiconductor structure 2. For example, in some embodiments a barrier layer of $Al_{x1}In_{y1}Ga_{z1}N$ and a channel layer of $Al_{x2}In_{y2}Ga_{z2}N$ may be formed, where the barrier layer has a larger bandgap than the channel layer. However, the techniques described herein are not limited as to the formation of heterostructures.

The semiconductor structure 2 may be processed using any suitable techniques to form one or more semiconductor devices therein. For example, as illustrated in FIG. 1A, a field effect transistor 4 having a source region S, a drain region D, and a gate G may be formed. In some embodiments, metal contacts to the source, drain and/or gate regions may be formed. The techniques described herein are not limited as to the formation of a transistor in the semiconductor structure 2, as any suitable semiconductor devices may be formed therein, such as a diode and/or a capacitor, for example.

In some embodiments, a method of protecting the semiconductor structure 2 from moisture may include removing moisture from the surface of the semiconductor structure 2. In some embodiments, moisture may be removed from the semiconductor structure 2 by heating the semiconductor structure 2 in an environment with no moisture or very low moisture content. For example, the semiconductor structure may be heated in a vacuum chamber in which a vacuum is created such that the pressure therein is below atmospheric pressure. In some embodiments, the vacuum may have a pressure of $1 \times 10^{-3}$ ton or lower. However, any suitable vacuum pressure may be used. In some embodiments, the semiconductor structure 2 may be heated to a temperature of 200° C. or higher, such as 250° C. or greater, 300° C. or higher, 350° C. or higher, or 400° C. or higher, for example. Heating the semiconductor structure 2 to higher temperatures above 200° C. may facilitate moisture desorption from the surface of the semiconductor structure 2, as discussed below.

Figure 2A:
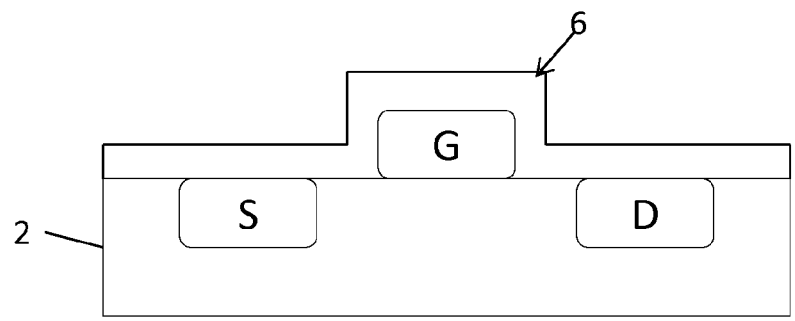
FIG. 2A shows an example of a semiconductor structure in which a layer of hydrophobic material is formed over a semiconductor device, according to some embodiments.

As shown in FIG. 2A, after removing moisture from the semiconductor structure 2, a layer of hydrophobic material 6 may be formed (e.g., deposited) over the semiconductor structure 2. The layer of hydrophobic material 6 may be formed after removing the moisture from the surface of the semiconductor structure 2 before moisture is allowed to re-adsorb onto the surface of the semiconductor structure 2. In some embodiments, if moisture is removed from the semiconductor structure 2 by heating the semiconductor structure 2 in a vacuum, the semiconductor structure 2 may be kept in vacuum until the step of depositing the hydrophobic material on the semiconductor structure 2, which may prevent moisture from re-adsorbing to the surface of the semiconductor structure 2 before the formation of the layer of hydrophobic material 6. The formation of the layer of hydrophobic material 6 may be performed in the same chamber as that in which the semiconductor structure is heated to remove moisture, or in a different chamber.

Any of a variety of suitable hydrophobic materials may be used in the layer of hydrophobic material 6. In some embodiments, the hydrophobic material may include a fluorocarbon, such as polytetrafluoroethylene, for example. However, the techniques described herein are not limited in this respect. Examples of suitable hydrophobic materials include, but are not limited to polytetrafluoroethylene (PTFE), polymethylmethacrylate (PMMA), benzocyclobutene (BCB), polyethylene, parylene and self-assembled monolayers (SAMs). In some embodiments, the hydrophobic material may be non-polar. In some embodiments, the hydrophobic material may be formed to be free of pinholes. The hydrophobic material may have one or more of the following characteristics: a water contact angle larger than 90 degrees, a surface free energy less than 100 milli-joule per meter squared (mJ/m$^2$), a dielectric constant less than 12, and/or a breakdown field strength less than 12 million volts/centimeter. In the hydrophobic material, the attraction between water molecules and the surface of the hydrophobic material may be weaker than the attraction between the water molecules.

In some embodiments, the surface of the layer of hydrophobic material 6 may be roughened to make it more hydrophobic. Any suitable technique may be used for increasing the surface roughness of the layer of hydrophobic material 6, such as those known in the art, for example. Increasing the surface roughness may make the layer of hydrophobic material 6 ultra-hydrophobic and/or super-hydrophobic. The water contact angle of the surface following such a treatment may be greater than 150 degrees. However, the techniques described herein are not limited as to surface treating the layer of hydrophobic material 6.

Figure 3A:
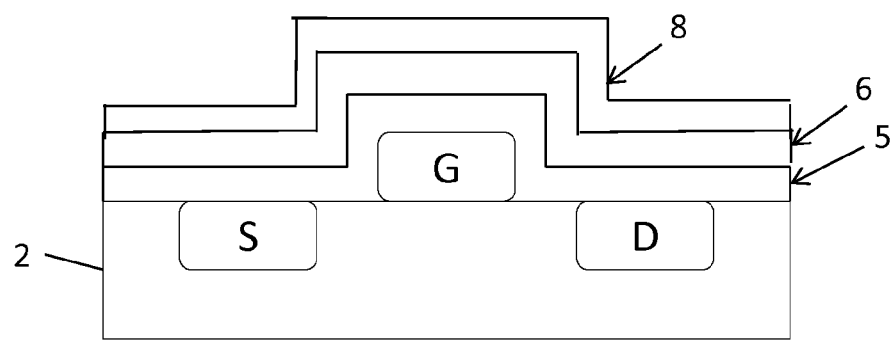
FIG. 3A shows an example of a semiconductor structure in which a dielectric layer and a layer of hydrophobic material is formed over a semiconductor device, according to some embodiments.

In the example of FIG. 2A, an embodiment is illustrated in which the layer of hydrophobic material 6 may be deposited directly on the surface of the semiconductor material. However, the techniques described herein are not limited in this respect, as one or more layers (e.g., dielectric layer(s)) may be formed between the semiconductor material and the layer of hydrophobic material 6. For example, as illustrated in FIG. 3A, in some embodiments a dielectric layer 5 may be formed over the semiconductor surface, and the layer of hydrophobic material 6 may be formed on the dielectric layer 5. Any suitable material may be used for dielectric layer 5, such as silicon nitride, alumina, silicon oxide, silicon oxynitride, or any suitable combination thereof, by way of example. Dielectric layer 5 may have any suitable thickness, such as between 10 and 10000 angstroms, for example. Any suitable number of layers may be formed between the dielectric layer 5 and the layer of hydrophobic material 6. Regardless of whether the layer of hydrophobic material 6 is formed directly on the semiconductor or formed on another layer, in some embodiments one or more dielectric layers and/or passivation layers 8 may be formed over the layer of hydrophobic material 6. Such layer(s) 8 may be formed of any suitable material, such as silicon nitride, alumina, silicon oxide, silicon oxynitride or any suitable combination thereof, by way of example.

Figure 1B:
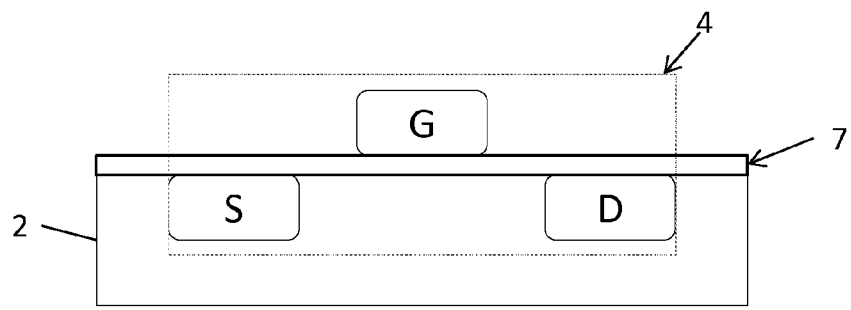
FIG. 1B shows an example of a semiconductor device formed in a semiconductor structure with a dielectric layer formed underneath the gate G.
Figure 2B:
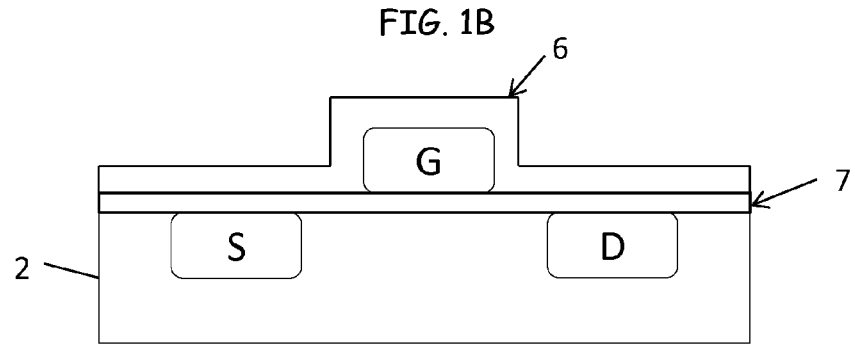
FIG. 2B shows an example of a semiconductor structure in which a layer of hydrophobic material is formed over a semiconductor device with a dielectric layer formed underneath the gate G, according to some embodiments.
Figure 3B:
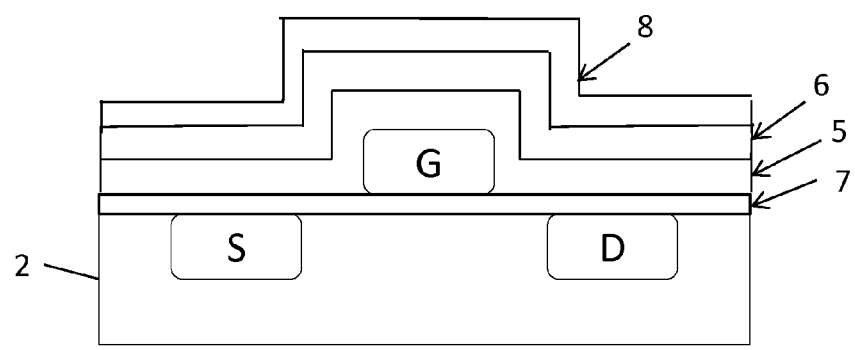
FIG. 3B shows an example of a semiconductor structure in which a dielectric layer and a layer of hydrophobic material is formed over a semiconductor device with a dielectric layer formed underneath the gate G, according to some embodiments.

In some embodiments, a dielectric layer 7 (e.g., a gate dielectric) may be formed between the gate G and semiconductor structure 2. FIGS. 1B, 2B and 3B show embodiments similar to the embodiments shown in FIGS. 1A, 2A and 3A, respectively, with the addition of a dielectric layer 7 between the semiconductor material and the gate G. In the embodiment of FIG. 2B, the layer of hydrophobic material 6 may be formed on the dielectric layer 7. In the embodiment of FIG. 3B, the dielectric layer 5 may be formed on the dielectric layer 7. Dielectric layers 5 and 7 may be formed of the same material or different materials. However, the techniques described herein are not limited as to the use of dielectric layers 5 or 7.

In some embodiments, when one or more dielectric layers is included below and/or above the layer of hydrophobic material 6, the semiconductor structure may be heated to a suitable temperature in vacuum to remove moisture and kept in vacuum until the deposition of a dielectric layer. If the semiconductors structure is removed from vacuum or otherwise exposed to moisture, the semiconductor structure may be re-heated in vacuum to remove moisture prior to the deposition of another layer, such as a dielectric layer or the layer of hydrophobic material 6.

In some embodiments, the surface of a dielectric layer, such as dielectric layer 5 and/or 7, for example, may be roughened. Any suitable technique may be used for increasing the surface roughness a dielectric layer. Such a surface treatment may make the dielectric layer hydrophobic, in some embodiments. The hydrophobic material may have one or more of the following characteristics: a water contact angle larger than 90 degrees, a surface free energy less than 100 milli-joule per meter squared (mJ/m$^2$), a dielectric constant less than 12, and/or a breakdown field strength less than 12 million volts/centimeter. In the hydrophobic material, the attraction between water molecules and the surface of the hydrophobic material may be weaker than attraction between the water molecules. If the surface of dielectric layer 5 and/or 7 is roughened, the layer of hydrophobic material 6 may be deposited on the roughened surface of the dielectric layer 5 or 7.

In some embodiments, after forming the layer of hydrophobic material 6 and optionally forming one or more dielectric layers, the semiconductor structure 2 may be packaged. In some embodiments, the semiconductor structure 2 may be packaged in a cavity having less than 30% relative humidity. In some embodiments, the semiconductor structure 2 may be packaged in a vacuum. Such techniques may reduce the amount of moisture to which the semiconductor structure 2 is exposed.

EXAMPLE

Experimental results have been demonstrated using AlGaN/GaN high electron mobility transistors. The devices were fabricated on AlGaN/GaN heterostructures grown on sapphire substrates using metal organic chemical vapor deposition (MOCVD). The thickness of the Al$_{0.25}$Ga$_{0.75}$N layer was 23 nm and the GaN buffer layer was 1.9 µm thick. AlGaN/GaN HEMTs were fabricated on these wafers using standard fabrication technology. Ohmic contacts were formed through Ti/Al/Ni/Au metallization and annealing at 870° C. A Ni/Au/Ni metal stack was used for the Schottky gate electrode. To observe the effect of moisture on an exemplary device, no passivation layer was deposited on the device surface. The gate-to-source/drain distance of the device was 1.5 µm. The gate length was 2.5 µm and the gate width was 150 µm.

Figure 4:
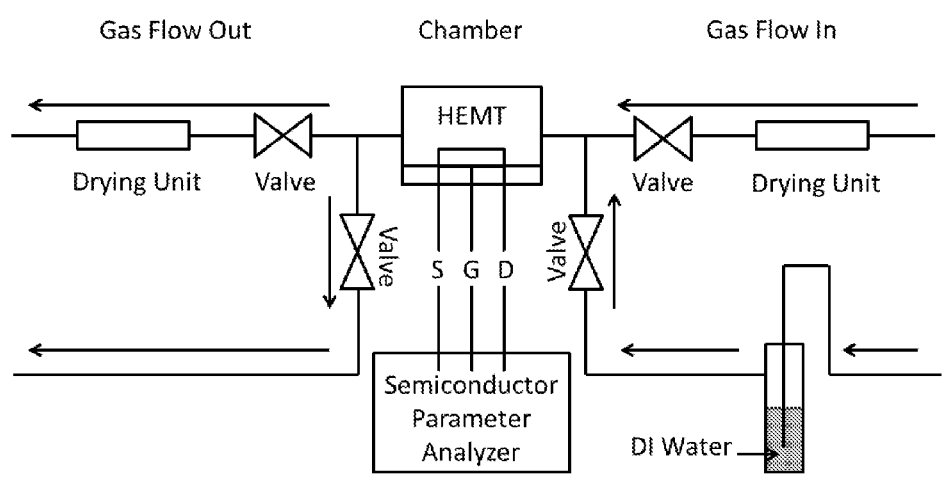
FIG. 4 shows a schematic of an experimental setup having a chamber in which gases can be introduced in a controlled way.
Figure 5A:
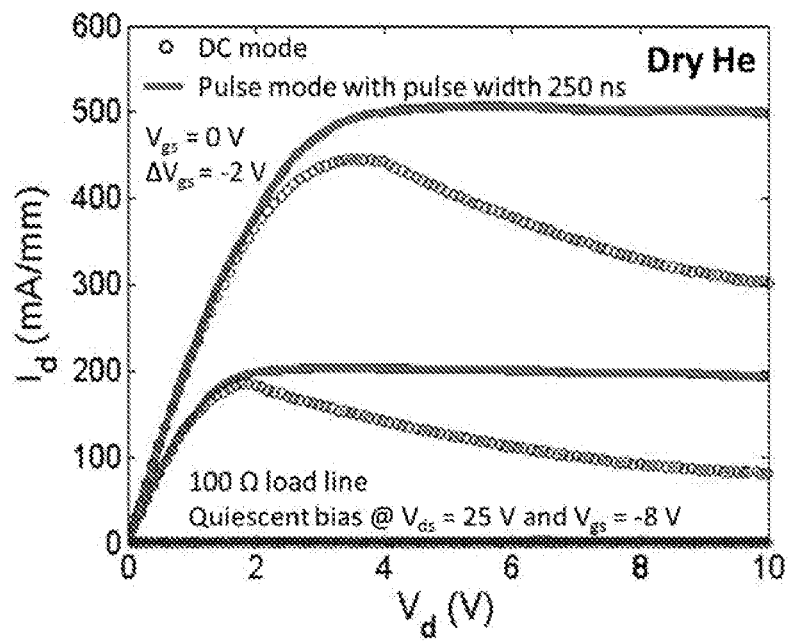
FIGS. 5A-5D show plots of drain current versus drain voltage for GaN-based transistors operated in a DC mode of operation and a pulse mode of operation with different pulse widths, in a dry helium environment.
Figure 5B:
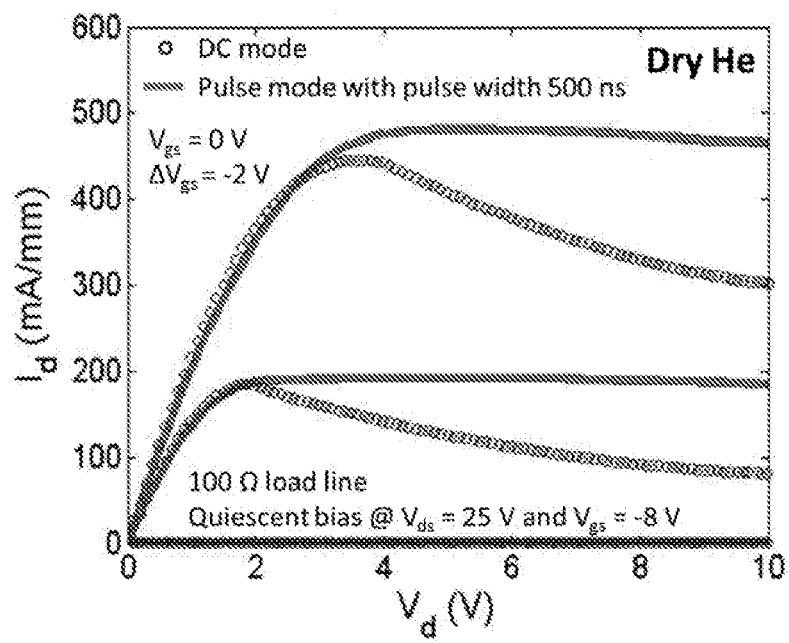
Figure 5C:
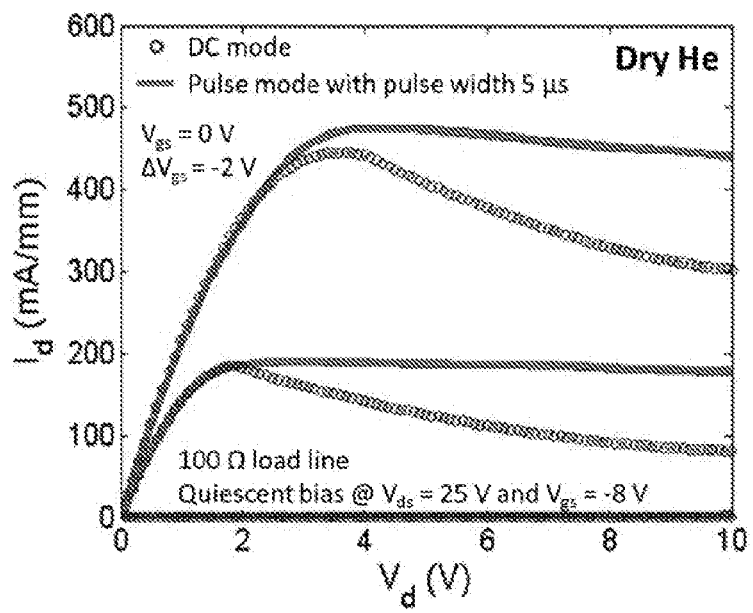
Figure 5D:
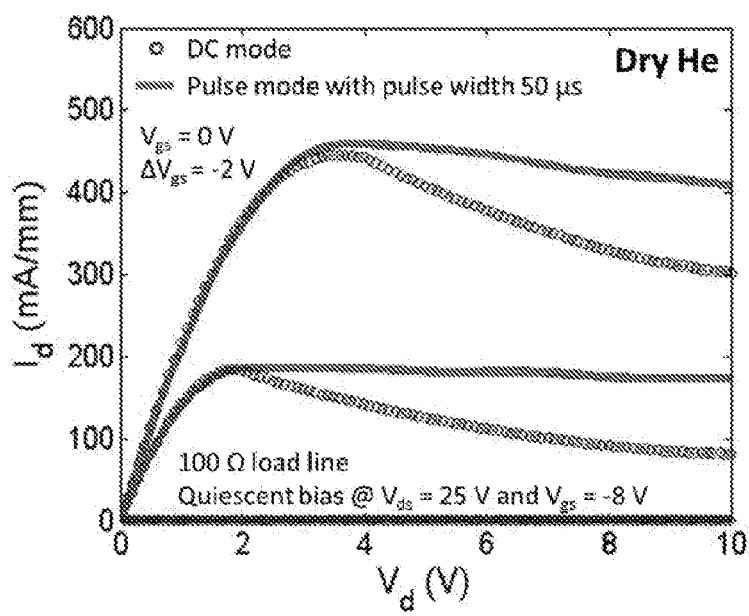
Figure 6A:
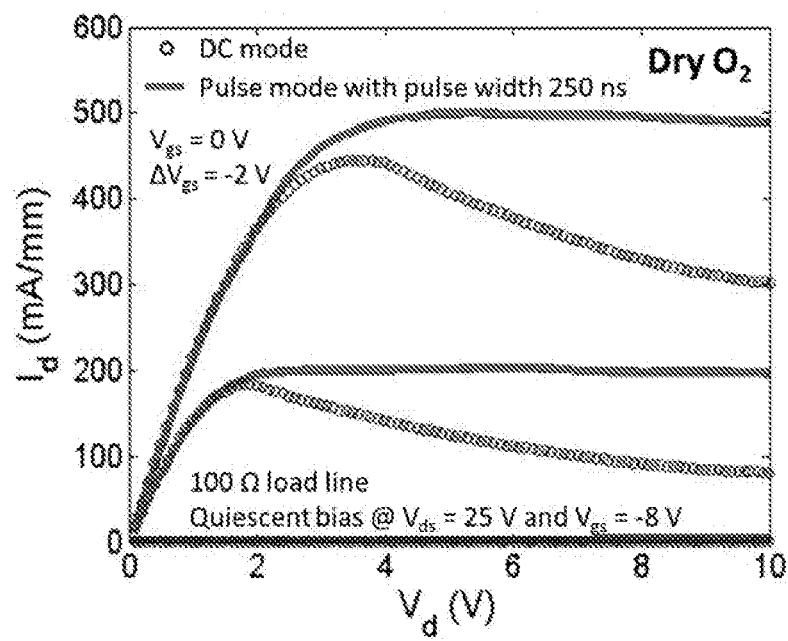
FIGS. 6A-6F show plots of drain current versus drain voltage for GaN-based transistors operated in a DC mode of operation and a pulse mode of operation in environments with dry oxygen, dry nitrogen, dry carbon dioxide, dry air, moisture-containing air, and wet helium, respectively.
Figure 6B:
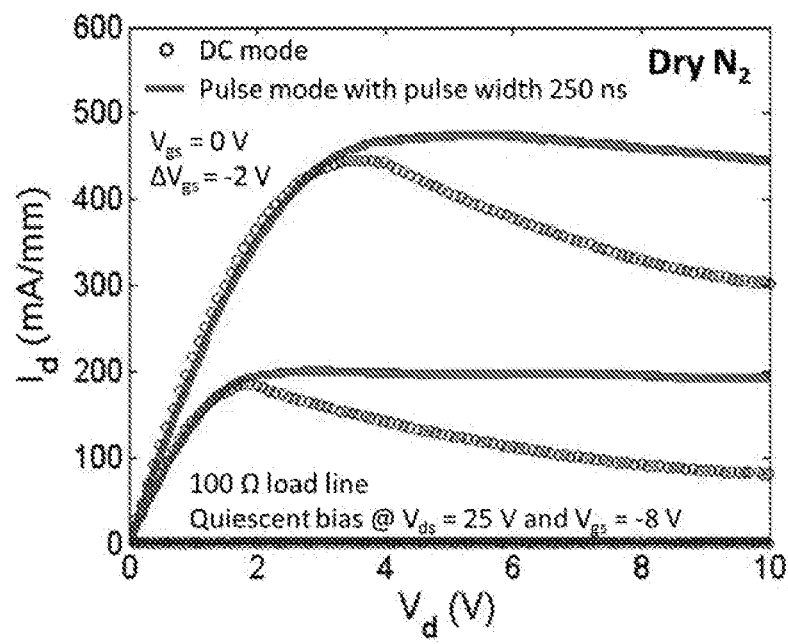
Figure 6C:
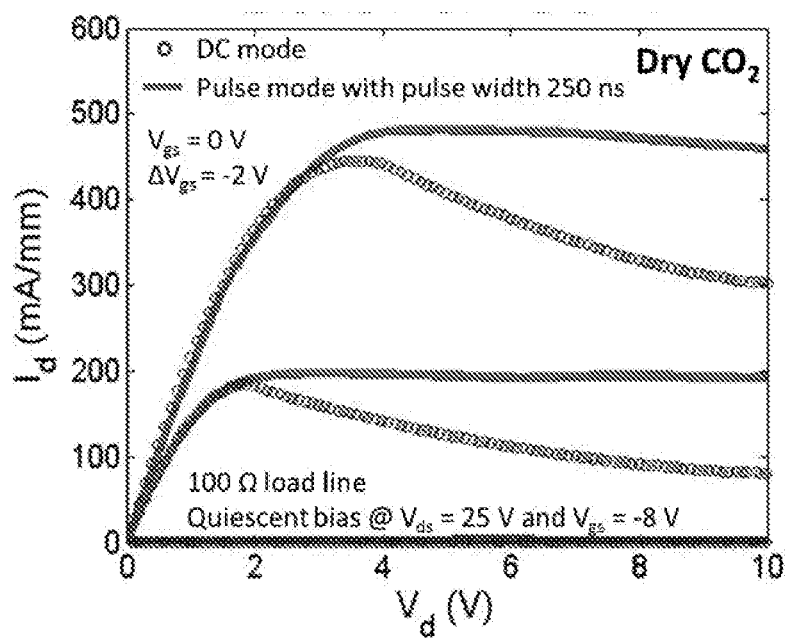
Figure 6D:
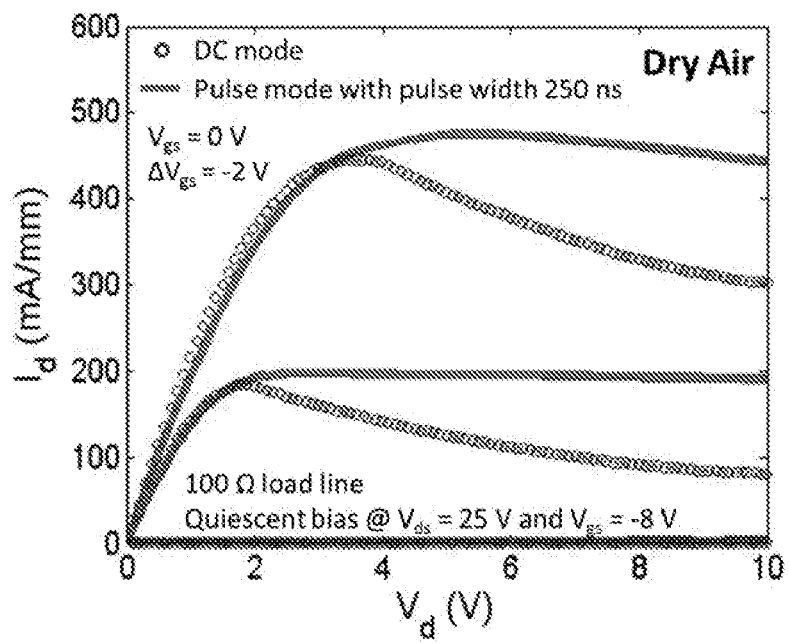
Figure 6E:
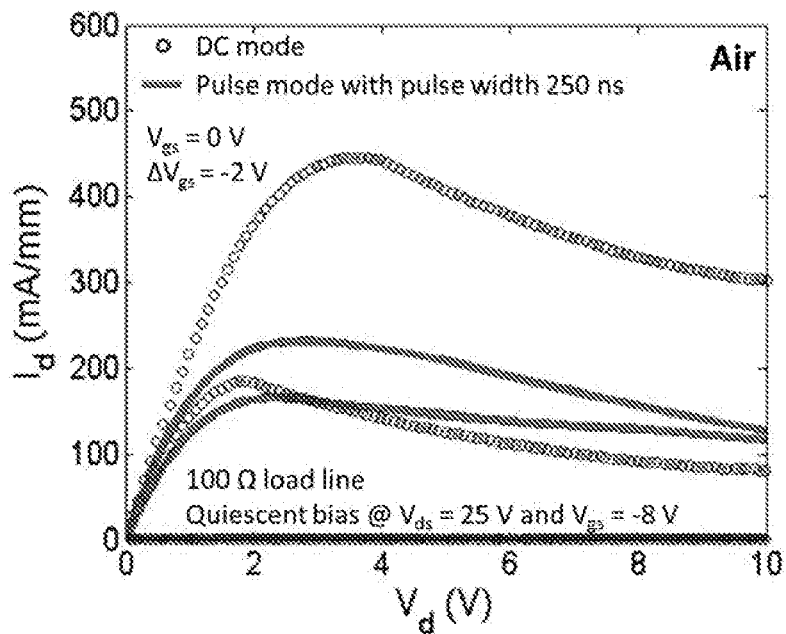
Figure 6F:
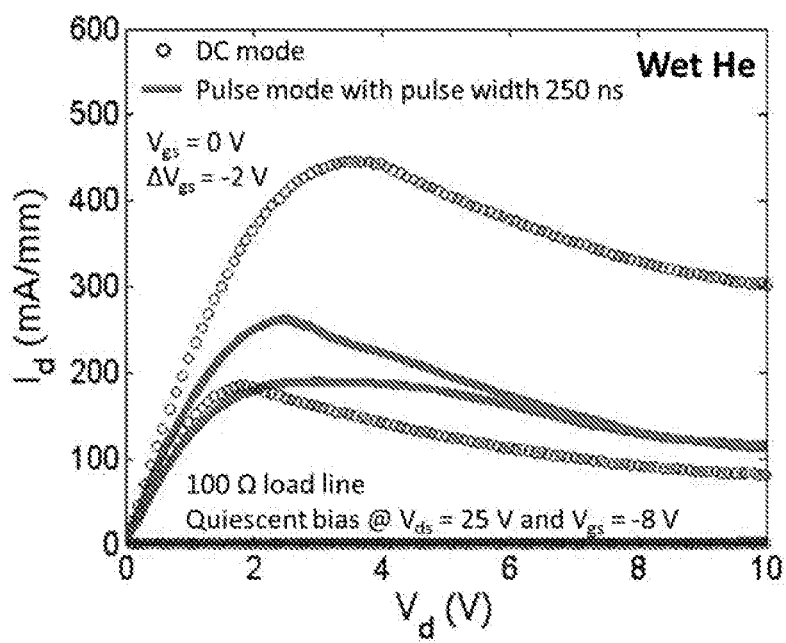

We used gas drying units from DRIERITE, which would dry air to a dew point of −100° F. at atmospheric pressure and room temperature, which is a relative humidity (RH) ≈0.01%. The experimental system is schematically shown in FIG. 4. The AlGaN/GaN HEMT was wire-bonded on a chip package and then mounted on the stage of an air-tight chamber where gases can flow through. The flowing gases passed through two different lines to make the chamber either dry or wet, by using four valves. In the dry gas line, two drying units were used to ensure the minimum moisture was present. In the wet gas line, the gases passed into deionized (DI) liquid water and emerged into the chamber carrying the saturated water vapor at room temperature with a relative humidity close to 100%. The rate of gas flow, set at 100 sccm, was controlled by a mass flow controller. DC measurements were then first performed on a fresh device. Then, pulsed IV measurements were operated on this device in the above two conditions respectively. The drain voltage was swept from 0 V to 25 V with an interval of 0.25 V and a 100Ω load line. In each drain sweeping step, the gate voltage was pulsed at 0 V with a pulse width of 250 ns, 500 ns, 5 µs and 50 µs respectively, and a base gate voltage at −8 V. We did not see any collapse of the drain current in pulse mode but the drain current increased instead due to the reduced effect of the self-heating in pulsed measurements as seen in FIG. 5A-5D. The same observations were obtained when the DC-RF measurements were repeated in dry oxygen gas, dry nitrogen gas, dry carbon dioxide gas and dry air, as shown in FIGS. 6A-6D. However, when the chamber was open so that the device was exposed to atmospheric water vapor or the water vapor carried by helium, current collapse and DC-RF dispersion were observed on the same device under the same operations of the DC and RF measurements as seen in FIGS. 6E and 6F.

Figure 7:
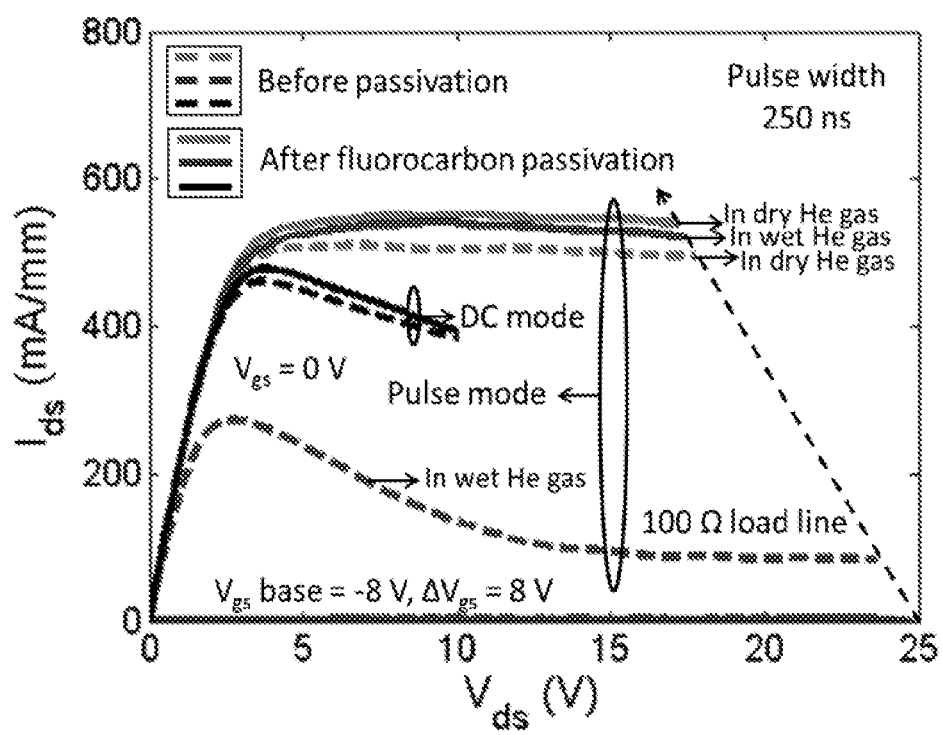
FIG. 7 shows plots of drain current versus drain voltage for GaN-based transistors operated in a DC mode of operation and a pulse mode of operation in various environments, with and without a fluorocarbon passivation layer.

To protect the device we formed devices that were passivated with a thin layer of a hydrophobic material to protect them from ambient water molecules. A fluorocarbon such as polytetrafluoroethylene is effective at preventing water adsorption due to the small surface energy of this material. We used vapor-deposited fluorocarbon (PTFE) as a passivation layer for AlGaN/GaN HEMTs as described above. The nominal thickness of the $C_4F_8$ (PTFE) is around 15 nm in our experiment. However, any thickness between 10 and 1000 angstroms may be used. The use of fluorocarbon passivation enabled the device to achieve the suppression of the current collapse in both dry and wet environments, as we repeated the RF measurements with the same pulse mode, the results of which are shown in FIG. 7.

Figure 8A:
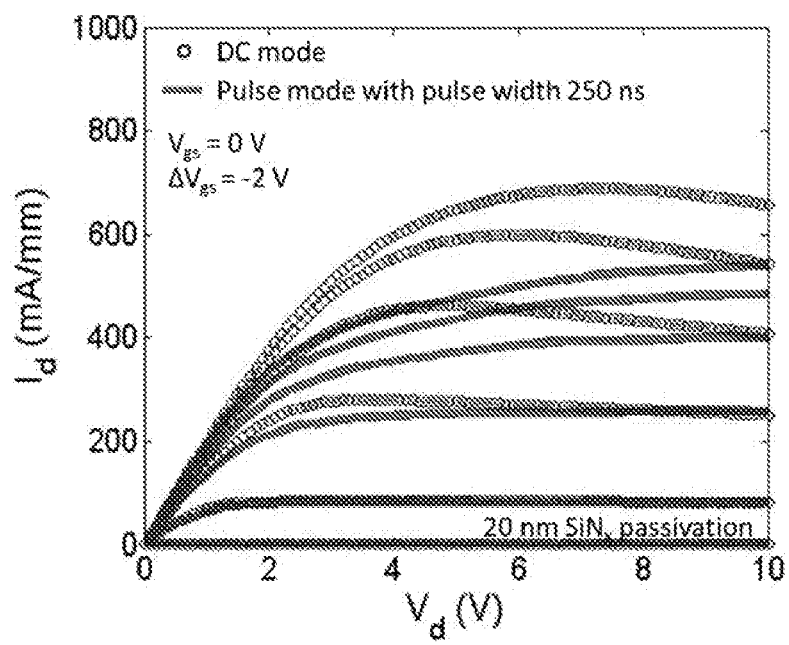
FIGS. 8A and 8B show plots of drain current versus drain voltage for GaN-based transistors operated in a DC mode of operation and a pulse mode of operation with only a silicon nitride passivation layer and with both a silicon nitride and fluorocarbon passivation layer, respectively.
Figure 8B:
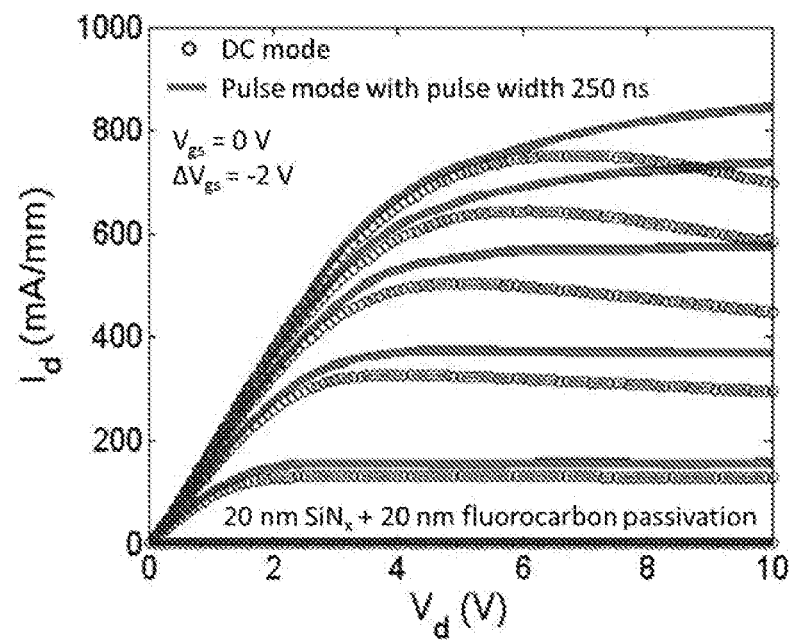

The effect of the fluorocarbon passivation to prevent the current collapse of AlGaN/GaN HEMTs was reinforced by passivating a thin layer of fluorocarbon on a thin layer of SiN passivation, as seen in FIGS. 8A-8B.

Figure 9:
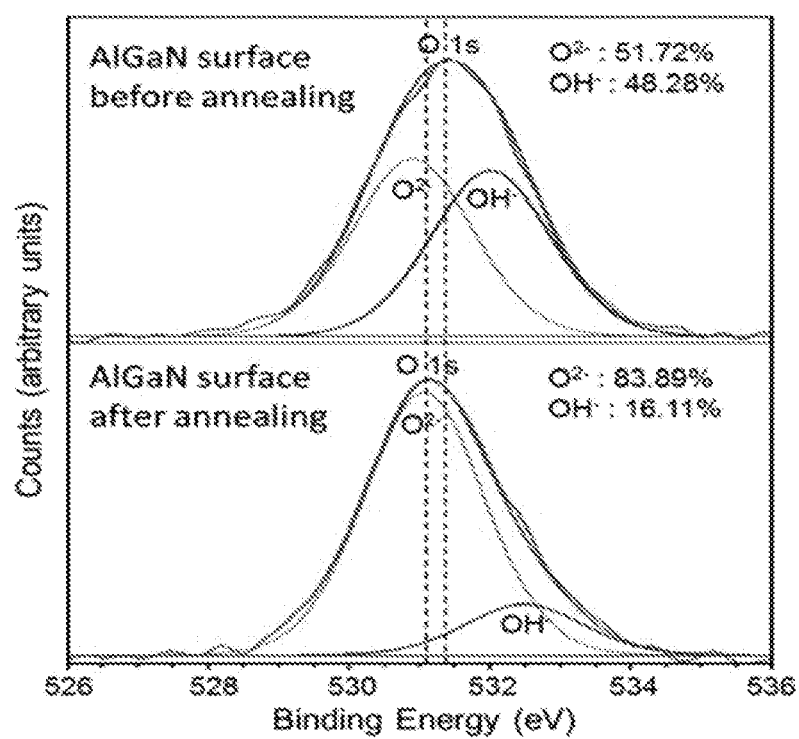
FIG. 9 shows plots of counts vs. binding energy illustrating the amount of O1s, $O_2$, and $OH^-$ present at the surface of the semiconductor structure before and after annealing, respectively.

Prior to deposition of the hydrophobic material, we used vacuum annealing to desorb the water layer adsorbed on the surface of AlGaN/GaN HEMTs. When exposed to ambient air, there exists a thin layer of adsorbed water on the surface of most solids. The adsorbed water molecules on AlGaN and/or GaN surface of unpassivated AlGaN/GaN HEMTs have been demonstrated to include a high concentration of surface hydroxyl ($OH^-$) groups by X-ray photoelectron spectroscopy (XPS) analysis. After annealing the sample at 300° C. in vacuum and in-situ measuring the surface O1s spectrum again by XPS in room temperature, FIG. 9 shows that the concentration of the water-related $OH^-$ group significantly decreased as a result of the desorption of the hydrogen-bonded water molecules on the surface.

We also found that water-related surface trapping states significantly influence the transient performance such as dynamic on-resistance and current collapse in AlGaN/GaN HEMTs as well. Moreover, the electrons trapped in the water layer in the off-state formed surface negative charges that could suppress the off-state gate current, especially for unpassivated and thin-layer passivated AlGaN/GaN HEMTs. A critical vacuum annealing temperature around 200-250° C. was identified to effectively desorb the surface water layer, and therefore suppress the trapping transients and increase the gate current, as shown in FIGS. 10A and 10B.

Figure 10A:
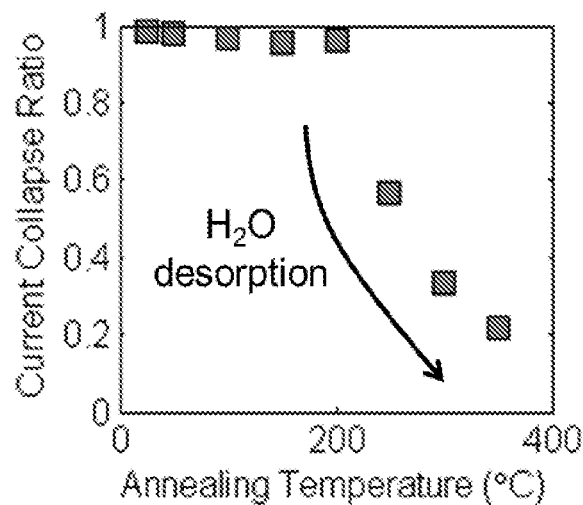
FIGS. 10A and 10B show plots of current collapse ratio and gate current vs. annealing temperature, illustrating increased $H_2O$ desorption for temperatures over 200° C.
Figure 10B:
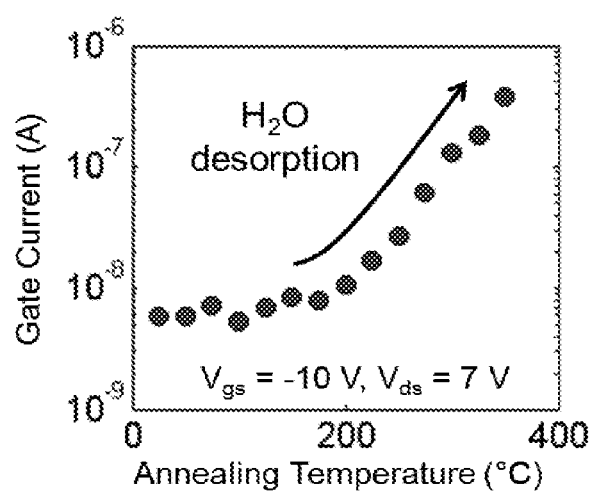

We note that i) all the electrical measurements were carried out in-situ after the vacuum annealing in the vacuum probe station, which means that the AlGaN/GaN HEMTs under test was never exposed to ambient air during and after the vacuum annealing; ii) After each step of the vacuum annealing, the device was cooled down to ensure that all the electrical measurements were carried out at room temperature; iii) the suppression of the trapping transients and the increase of the off-state gate current were both reversible, which means that if we break the vacuum and let the AlGaN/GaN HEMTs expose to ambient air then trapping transients would come back and gate current would decrease to the initial level as indicated in the most left points in FIGS. 10A and 10B.

Described herein is a novel method to suppress the current collapse, DC-RF dispersion, dynamic on resistance of nitride-based semiconductor devices and improve the long-term reliability of these devices by protecting the devices from moisture. This method is inexpensive and hence very attractive for commercialization.

Exemplary applications of devices passivated using such a method includes power electronics, RF switches, RF amplifiers, light emitting diodes and lasers, by way of example. In some embodiments, such techniques may be used to form digital electronics.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A method of protecting a semiconductor structure from water, the semiconductor structure comprising a wide-bandgap semiconductor material in which at least one semiconductor device is formed, the method comprising:
   heating the semiconductor structure in a vacuum to a temperature of at least 200° C. to remove water from the semiconductor structure; and
   after the heating of the semiconductor structure, forming a layer comprising a hydrophobic material over the semiconductor structure, wherein the semiconductor structure is kept in the vacuum between the heating of the semiconductor structure and the forming of the layer comprising the hydrophobic material.

2. The method of claim 1, wherein the wide-bandgap semiconductor material comprises a III-V nitride semiconductor material.

3. The method of claim 2, wherein the III-V nitride semiconductor material comprises an $Al_xIn_yGa_zN$ material in which one or more of x, y and z is greater than zero.

4. The method of claim 1, wherein the vacuum has a pressure of $1 \times 10^{-3}$ torr or lower.

5. The method of claim 1, wherein the heating of the semiconductor structure is performed in a first vacuum chamber and the forming of the layer comprising a hydrophobic material is performed in the first vacuum chamber or a second vacuum chamber.

6. The method of claim 1, wherein the hydrophobic material has a water contact angle larger than 90°.

7. The method of claim 1, wherein the hydrophobic material has a surface free energy less than 100 milli-joule per meter squared ($mJ/m^2$).

8. The method of claim 1, wherein the hydrophobic material has a dielectric constant less than 12.

9. The method of claim 1, wherein the hydrophobic material includes at least one material selected from the group consisting of polytetrafluoroethylene (PTFE), polymethylmethacrylate (PMMA), benzocyclobutene (BCB), polyethylene, parylene and a self-assembled monolayer (SAM).

10. The method of claim 1, further comprising forming a dielectric layer, wherein the layer comprising the hydrophobic material is formed over the dielectric layer.

11. The method of claim 10, wherein the semiconductor device comprises a transistor and the dielectric layer is formed underneath a gate of the transistor.

12. The method of claim 10, further comprising forming a second dielectric layer and/or a passivation layer over the layer comprising the hydrophobic material.

13. The method of claim 1, further comprising forming a dielectric layer and/or a passivation layer over the layer comprising the hydrophobic material.

14. The method of claim 1, further comprising increasing a surface roughness of the layer comprising the hydrophobic material.

15. The method of claim 14, wherein the surface roughness of the layer is increased such that the layer has a water contact angle larger than 150°.

16. The method of claim 1, further comprising increasing a surface roughness of the semiconductor structure prior to forming the layer comprising the hydrophobic material.

17. The method of claim 1, further comprising packaging the semiconductor structure in an environment having less than 30% relative humidity.

18. The method of claim 17, wherein packaging the semiconductor structure comprises packaging the semiconductor structure in a vacuum.

19. A semiconductor structure comprising a wide-bandgap semiconductor material in which at least one semiconductor device is formed, the semiconductor structure being formed by a method comprising:

heating the semiconductor structure in a vacuum to a temperature of at least 200° C. to remove water from the semiconductor structure; and after the heating of the semiconductor structure, forming a layer comprising a hydrophobic material over the semiconductor structure, wherein the semiconductor structure is kept in the vacuum between the heating of the semiconductor structure and the forming of the layer comprising the hydrophobic material.

20. The semiconductor structure of claim 19, wherein the hydrophobic material includes at least one material selected from the group consisting of polytetrafluoroethylene (PTFE), polymethylmethacrylate (PMMA), benzocyclobutene (BCB), polyethylene, parylene and a self-assembled monolayer (SAM).

* * * * *